United States Patent [19]
Kuriyama

[11] Patent Number: 5,459,641
[45] Date of Patent: Oct. 17, 1995

[54] POLAR ELECTRONIC COMPONENT AND MOUNTING STRUCTURE THEREFOR

[75] Inventor: Chojiro Kuriyama, Kyoto, Japan

[73] Assignee: Rohm Co. Ltd., Kyoto, Japan

[21] Appl. No.: 388,414

[22] Filed: Feb. 14, 1995

[30] Foreign Application Priority Data

Feb. 18, 1994 [JP] Japan ................................. 6-020853

[51] Int. Cl.⁶ .............................. H05K 7/02; H01L 23/28
[52] U.S. Cl. ...................... 361/760; 361/763; 361/772; 361/773; 361/777; 174/52.2; 174/260; 257/692; 257/693; 257/696; 257/787
[58] Field of Search ................................. 361/760–764, 361/772–774, 777–778; 174/52.2, 260–263; 257/690–696, 787

[56] References Cited

U.S. PATENT DOCUMENTS

| | | |
|---|---|---|
| 4,574,297 | 3/1986 | Ooi ........................................ 361/773 |
| 4,945,398 | 7/1990 | Kurita et al. . |
| 5,107,324 | 4/1992 | Iwahara et al. .......................... 361/772 |
| 5,379,189 | 1/1995 | Merriman ............................... 361/760 |

*Primary Examiner*—Bot L. Ledynh
*Attorney, Agent, or Firm*—Michael D. Bednarek

[57] ABSTRACT

A polar electronic component is provided which comprises a polar element, a first lead electrically connected to a first pole of the polar element, a second lead electrically connected to a second pole of the polar element, and an insulating package enclosing the polar element together with part of the first and second leads. The first lead has two terminal legs which are bent toward the underside of the package and transversely spaced from each other by an interval. The second lead has a terminal leg which is bent toward the underside of the package and extends into the spacing between the two terminal legs of the first lead in longitudinally overlapping relation.

6 Claims, 5 Drawing Sheets

POLAR ELECTRONIC COMPONENT AND MOUNTING STRUCTURE THEREFOR

BACKGROUND OF THE INVENTION

1. Field of the Invention

This invention relates to a polar electronic component such as a solid electrolytic capacitor or diode which is designed for conveniently mounting to a circuit carrier by soldering. The present invention also relates to a structure for mounting such a polar electronic component to a circuit carrier such as a printed circuit board.

2. Description of the Related Art

A solid electrolytic capacitor, which is a typical example of polar electronic component, is known from Japanese Patent Publication No. 3(1991)-30977 for example. The capacitor disclosed in this Japanese document has such a structure as shown in FIGS. 9 to 11.

Specifically, the prior art capacitor comprises a capacitor element 11 which includes a capacitor chip 11a and an anode wire 11b projecting from the chip 11a. The capacitor also includes an anode lead 12 in electrical connection with the anode wire 11b, and a cathode lead 13 in electrical connection to the chip 11a. The capacitor element 11 together with part of the respective leads 12, 13 is enclosed in a resin package 14. The respective leads 12, 13 project out from opposite side faces 14a, 14b of the package 14 and are bent toward the underside of the resin package 14 for conveniently mounting, by soldering, to a surface of a printed circuit board A' (see FIG. 11) which carries an anode-side electrode pad A1' and a cathode-side electrode pad A2'.

According to the prior art arrangement, the resin package 14 together with the projecting portions of the respective leads 12, 13 is symmetric with respect to a central plane transverse to the anode wire 11b. Therefore, the polarity of the capacitor is not visually recognizable, so that the capacitor may be erroneously mounted on the circuit board A' in reverse polarity. The capacitor thus erroneously mounted generates a lot of heat, consequently damaging the capacitor and its related components in a critical way.

The polarity of the capacitor may be rendered visually recognizable by making the respective leads 12, 13 asymmetric with respect to their configurations and/or by forming a marking (not shown) on the upper face of the resin package 14 near one of the leads 12, 13. However, the asymmentry of the respective leads 12, 13 are not readily recognizable due to the small size of the capacitor, whereas the marking of the package 14 is not recognizable from below the capacitor. Thus, the slot or marking may still fail to provide an intended prevention of erroneous mounting of the capacitor.

Similar problems are also encountered in other surface mounting type polar electronic components such as a diode.

SUMMARY OF THE INVENTION

It is, therefore, an object of the present invention to provide a polar electronic component, such as a solid electrolytic capacitor or a diode, which can be reliably prevented from being erroneously mounted and soldered to a circuit carrier with reverse polarity.

According to one aspect of the present invention, there is provided a polar electronic component comprising: a polar element having a first pole and a second pole opposite in polarity to the first pole; a first lead electrically connected to the first pole of the polar element; a second lead electrically connected to the second pole of the polar element; and an insulating package enclosing the polar element together with part of the first and second leads, the package having a mounting face; wherein the first lead has two terminal legs which are bent toward the mounting face of the package and transversely spaced from each other by an interval; and wherein the second lead has a terminal leg which is bent toward the mounting face of the package and extends into the spacing between the two terminal legs of the first lead in longitudinally overlapping relation, the terminal leg of the second lead having a width smaller than the interval between the two terminal terminal legs of the first lead.

According to a preferred embodiment of the present invention, the package has a first side face and a second side face opposite to the first side face. The two terminal legs of the first lead project out from the first side face of the package, whereas the terminal leg of the second lead projects out from the second side face of the package.

The electronic component may be a solid electrolytic capacitor or a diode.

According to another aspect of the present invention, there is provided a structure for mounting a polar electronic component on a circuit carrier, the component comprising: a polar element having a first pole and a second pole opposite in polarity to the first pole; a first lead electrically connected to a first pole of the polar element; a second lead electrically connected to a second pole of the polar element; and an insulating package enclosing the polar element together with part of the first and second leads, the package having a mounting face; wherein the first lead has two terminal legs which are bent toward the mounting face of the package and transversely spaced from each other by an interval; wherein the second lead has a terminal leg which is bent toward the mounting face of the package and extends into the spacing between the two terminal legs of the first lead in longitudinally overlapping relation, the terminal leg of the second lead having a width smaller than the interval between the two terminal terminal legs of the first lead; wherein the circuit carrier is formed with a pair of first electrode pads which are spaced from each other and attached in electric conduction with the two terminal legs of the first lead; and wherein the circuit carrier is also formed with a second electrode pad located between the pair of first electrode pads and attached in electric conduction with the terminal leg of the second lead.

Preferably, the first and second electrode pads are in the form of strips having respective end edges, and the end edges of the first electrode pads are aligned with the end edge of the second electrode pad.

Other objects, features and advantages of the present invention will be fully understood from the following detailed description given with reference to the accompanying drawings.

DETAILED DESCRIPTION OF THE PREFERRED EMBODIMENTS

Figure 1:
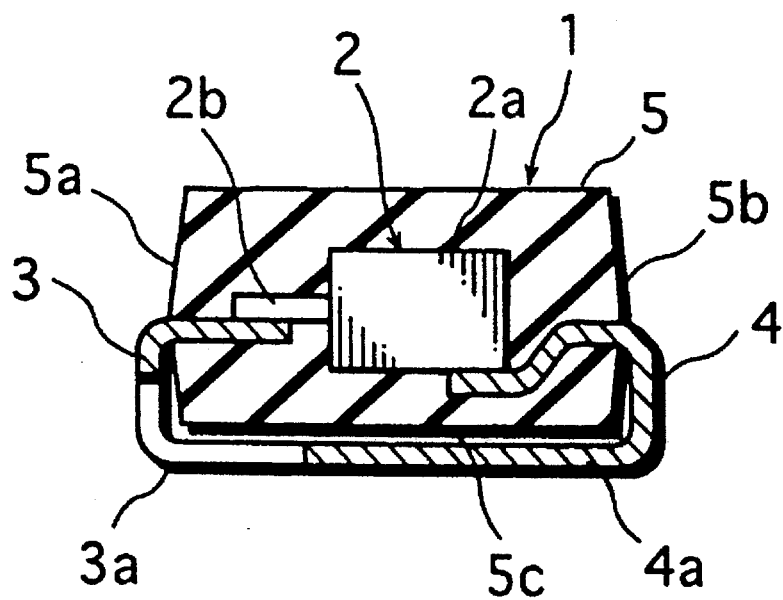
FIG. 1 is a front view, in vertical section, showing a solid electrolytic capacitor as a first embodiment of the present invention.
Figure 2:
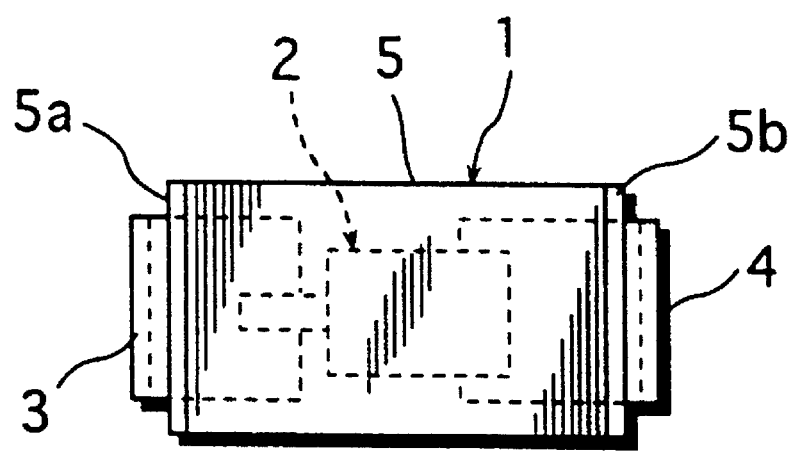
FIG. 2 is a top plan view showing the same capacitor.

Referring first to FIGS. 1 to 5 of the accompanying drawings, there is shown a first embodiment of polar electronic component. According to the this embodiment, the polar electronic component is a solid electrolytic capacitor 1 such as a tantalum capacitor or an an aluminum capacitor.

The capacitor 1 of the first embodiment comprises a capacitor element 2 which includes a capacitor chip 2a and an anode wire 2b projecting from the chip 2a. The chip 2a may be a compacted mass of tantalum powder for example, in which case the anode wire 2b is also made of tantalum.

The capacitor 1 also includes an anode lead 3 (positive lead) and a cathode lead 4 (negative lead), each of which is in the form of a metal plate. The anode lead 3 is electrically connected to the anode wire 2b by welding for example. The cathode lead 4 is electrically connected directly to the chip 11a by soldering or by using a conductive adhesive. Alternatively, the cathode lead 4 may be electrically connected to the chip 2a via an unillustrated safety fuse (not shown) which may be a temperature fuse or an overcurrent fuse for example.

The capacitor element 2 together with part of the respective leads 3, 4 are enclosed in a package 5 of a thermosetting resin (epoxy resin for example). The anode lead 3 partially projects from a first side face 5a of the package 5, whereas the cathode lead 4 partially projects from a second side face 5b of the package 5 opposite to the first side face 5a. The projecting portions of the respective leads 3, 4 are bent downwardly and inwardly toward a bottom face 5c of the resin package 5 for convenient surface mounting.

Figure 3:
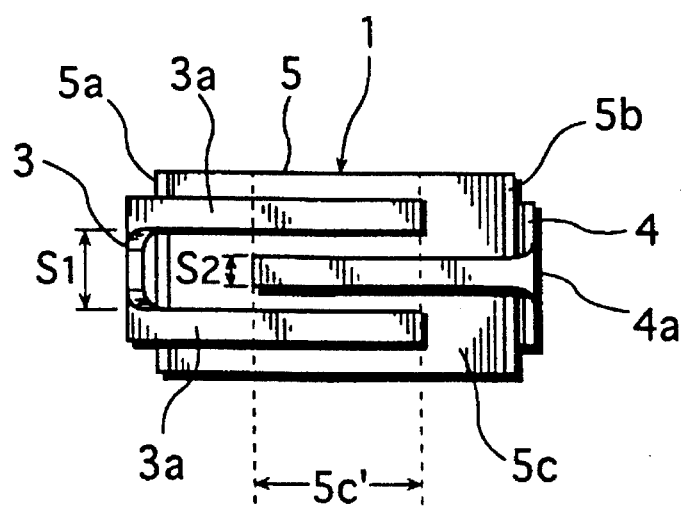
FIG. 3 is a bottom view showing the same capacitor.
Figure 4:
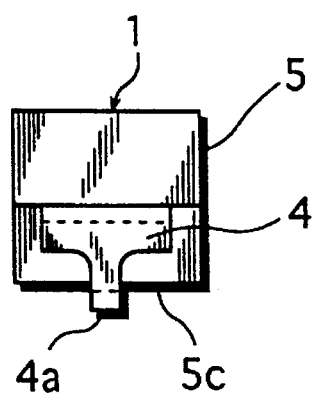
FIG. 4 is a right side view showing the same capacitor.
Figure 5:
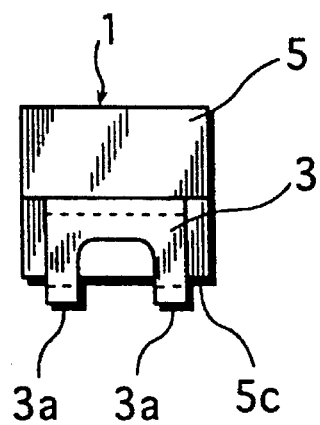
FIG. 5 is a left side view showing the same capacitor.

According to the first embodiment, the anode lead 3 has two integral terminal legs 3a which are transversely spaced from each other by an interval S1, as shown in FIG. 3. Conversely, the cathode lead 4 has only one integral terminal leg 4a extending into the spacing between the two terminal legs 3a of the anode lead 3. Thus, the terminal leg 4a of the cathode lead 4 longitudinally overlaps the two terminal legs 3a of the anode lead 3 in a central region 5c' of the bottom face 5c of the resin package 5. The terminal leg 4a of the cathode lead 4 has a width S2 which is smaller than the interval S1 between the two terminal legs 3a of the anode lead 3.

Figure 6:
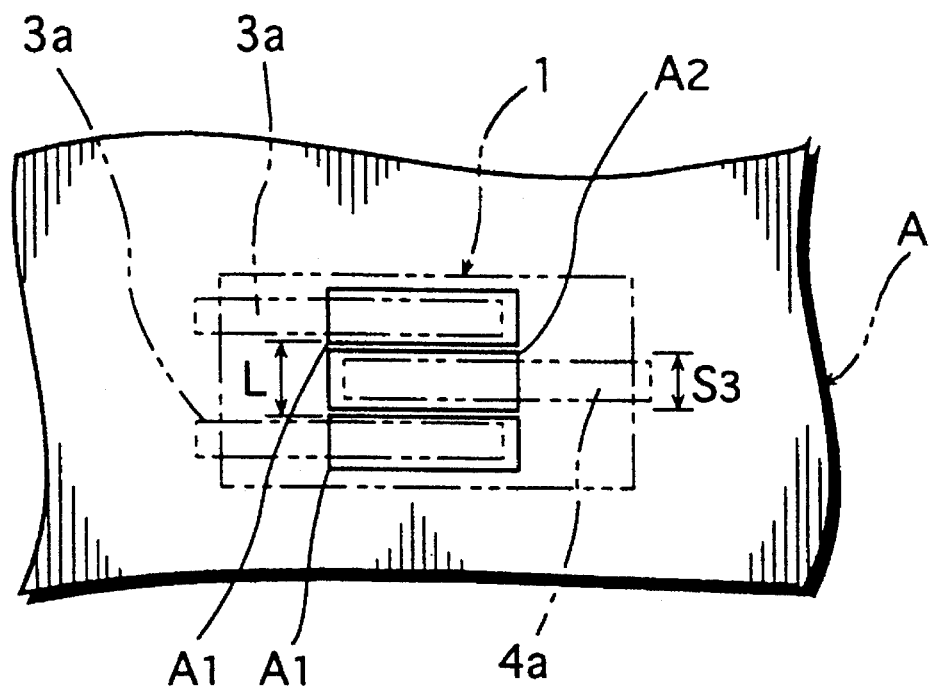
FIG. 6 is a plan view showing the same capacitor as mounted on a printed circuit board in one orientation.
Figure 7:
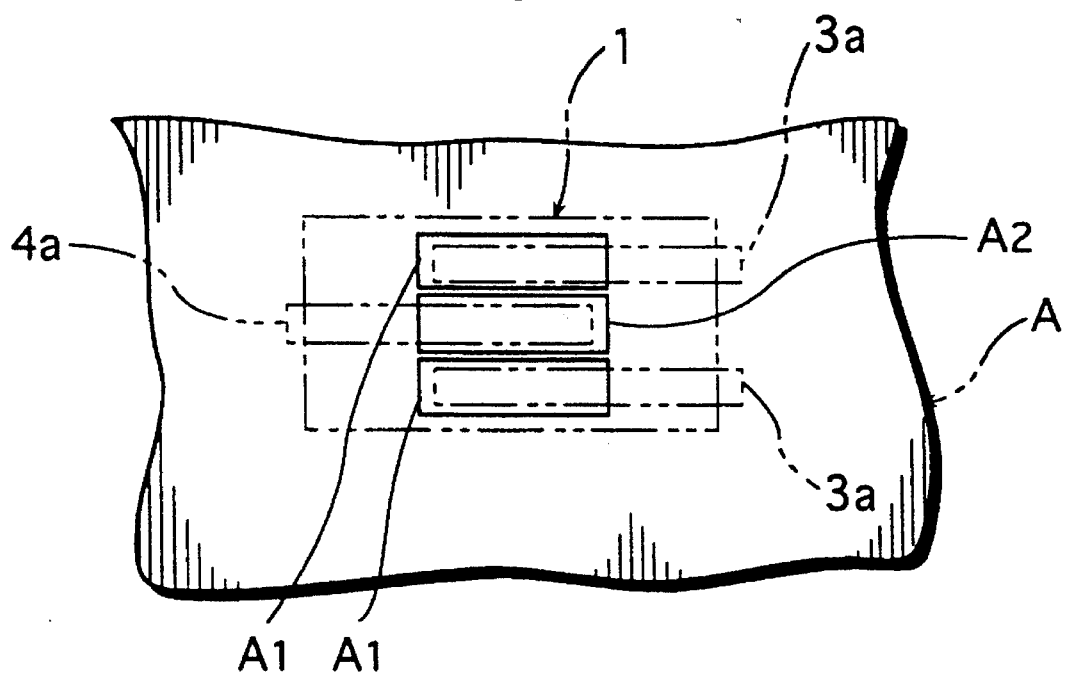
FIG. 7 is a plan view showing the same capacitor as mounted on a printed circuit board in another orientation.

In use, the capacitor 1 may be mounted on a surface of a printed circuit board A (circuit carrier) which carries two anode-side electrode pads A1 in corresponding relation to the two terminal legs 3a of the anode lead 3, and a cathode-side electrode pad A2 in corresponding relation to the terminal leg 4a of the cathode lead 4, as shown in FIGS. 6 and 7. The two anode-side electrode pads A1 are in the form of strips which are transversley spaced from each other by an interval L. The cathode-side electrode pad A2 is also in the form of a strip located between the two anode-side electrode pads A1 and having a width S3 which is smaller than the interval L between the two anode-side electrode pads A1 but larger than the width S2 of the terminal leg 4a of the cathode lead 4.

According to the first embodiment, the end edges of the respective electrode pads A1, A2 are aligned with other. However, the end edges of the respective electrode pads A1, A2 may be slightly staggered as long as the cathode-side electrode pad A2 longitudinally overlaps the anode-side electrode pad A1 by a suitable amount.

Though not shown, wiring conductors for the anode-side and cathode-side electrode pads A1, A2 may be formed to extend rightward or leftward (as seen in FIG. 6) from these pads. Alternatively, the wiring conductor for the cathode-side electrode pad A2 may be formed to extend rightward or leftward, whereas the wiring conductors for the anode-side electrode pads A1 may be formed to extend upward and downward (as seen in FIG. 6), respectively. Further alternatively, one or more of the anode-side and cathode-side electrode pads A1, A2 may be electrically connected to a wiring conductor pattern on the reverse surface of the circuit board A (which surface is opposite to the surface of the circuit board A carrying the capacitor 1) by means of conductive through-holes formed in the wall thickness of the circuit board A.

With the arrangement described above, the capacitor 1 can be mounted on the circuit board A in two different mounting orientations but with correct polarity.

Specifically, as shown in FIG. 6, the capacitor 1 may be oriented so that the anode lead 3 is located on the lefthand side with the cathode lead 4 located on the righthand side. In this orientation, the two terminal legs 3a of the anode lead 3 comes into contact with the respective anode-side electrode pads A1 on the circuit board A. Thus, the polarity of the capacitor 1 is kept correct.

Conversely, as shown in FIG. 7, the capacitor 1 may be oriented so that the anode lead 3 is located on the righthand side with the cathode lead 4 located on the lefthand side. In this orientation, again, the two terminal legs 3a of the anode lead 3 comes into contact with the respective anode-side electrode pads A1 on the circuit board A. Thus, the polarity of the capacitor 1 is still kept correct.

As described above, it is possible to prevent the capacitor 1 from being erroneously mounted (soldered) in reverse polarity. Thus, the capacitor 1 and the circuit incorporating it can be prevented from suffering faults and failures which would be caused by erroneous reverse-polarity mounting, and there is no need to provide a device or any form of expedient for recognizing the polarity of the capacitor 1. Further, a plurality of similar capacitors can be mounted at a high speed.

Apparently, the respective configurations of the anode and cathode leads 3, 4 may be reversed. Specifically, the cathode lead 4 may be made to have two terminal legs which are transversely spaced from each other, whereas the anode lead 3 may be made to have a single terminal leg extending into the spacing between the two terminal legs of the cathode lead.

Figure 8:
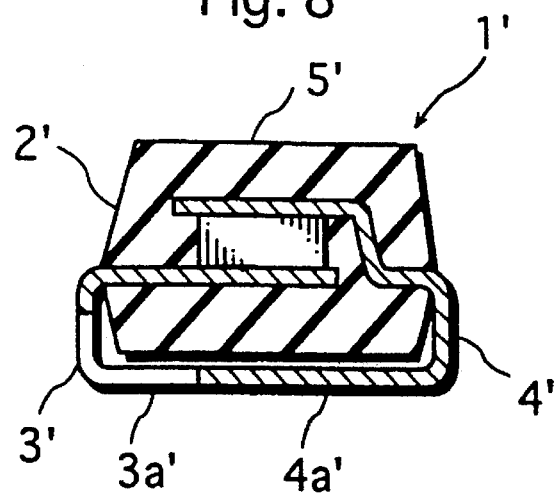
FIG. 8 is a front view, in vertical section, showing a diode as a second embodiment of the present invention.
Figure 9:
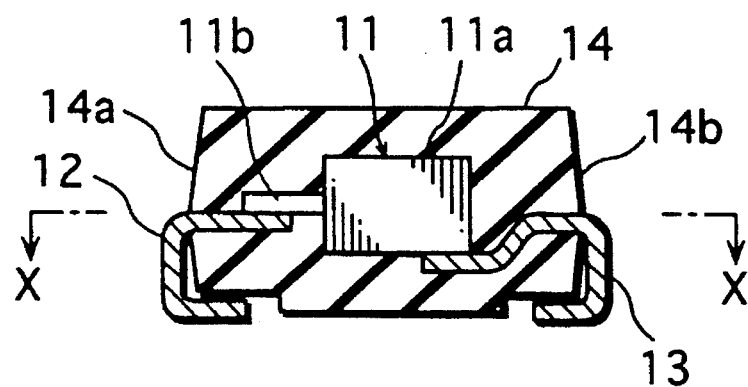
FIG. 9 is a front view, in vertical section, showing a prior art solid electrolytic capacitor.
Figure 10:
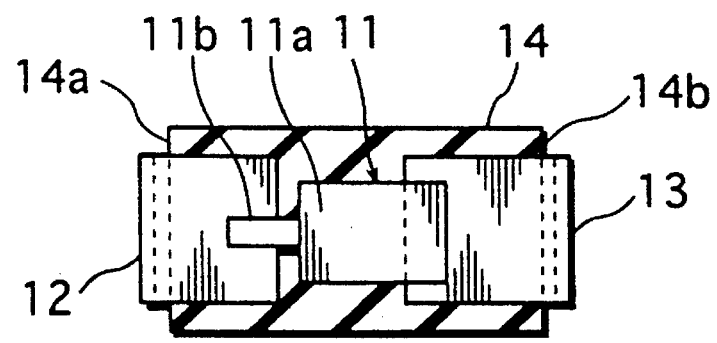
FIG. 10 is a sectional view taken along lines X—X in FIG. 9.
Figure 11:
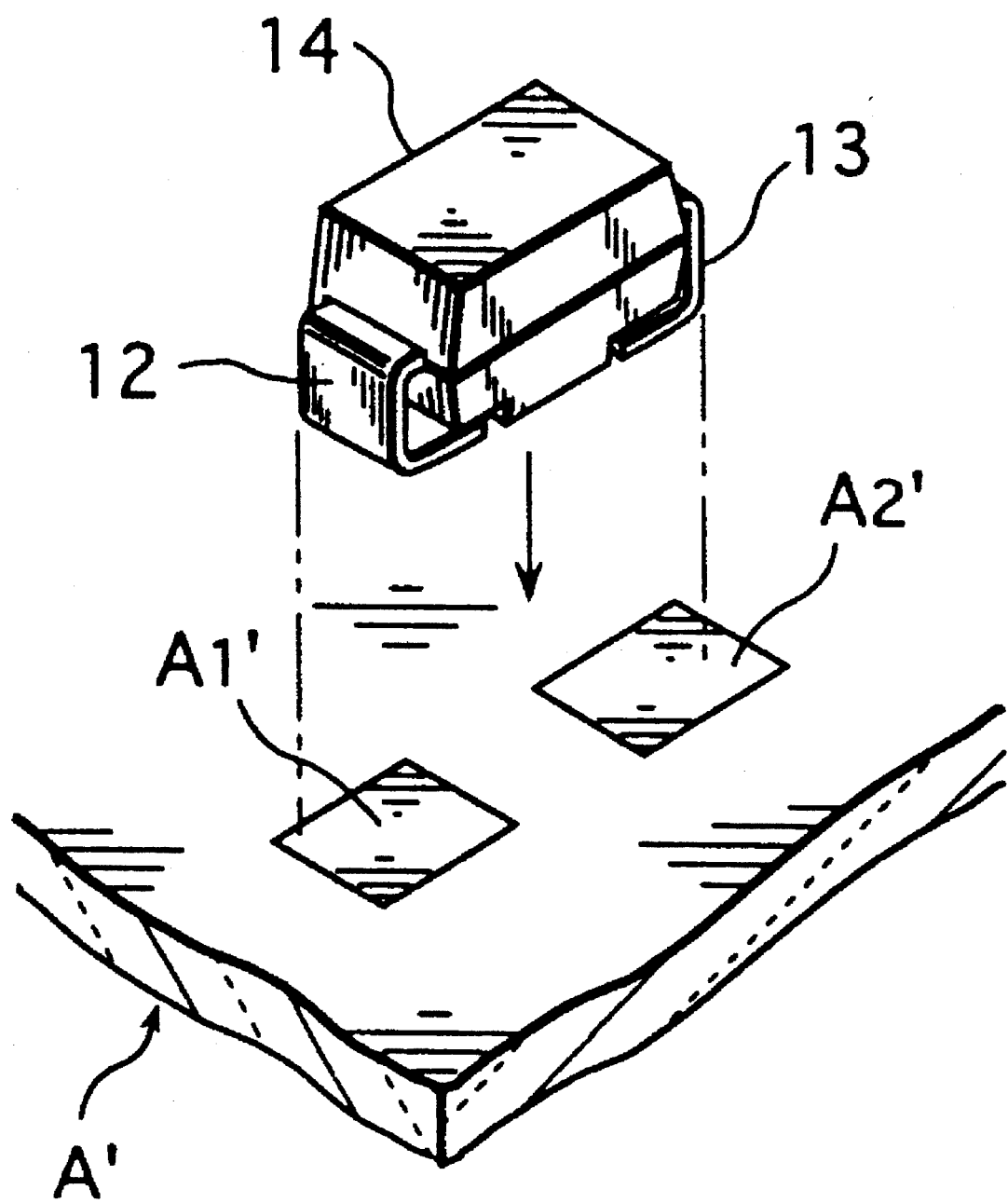
FIG. 11 is a perspective view showing the prior art capactiro at the time of mounting to a circuit board.

FIG. 8 shows a polar electronic component according to a second embodiment of the present invention. The electronic component of this embodiment is a diode 1' which comprises a semiconductor diode chip 2', a first lead 3' electrically connected to a first pole (e.g. positive pole) of the diode chip 2', a second lead 4' electrically connected to a second pole (e.g. negative pole) of the diode chip 2', and a resin package 5' enclosing the diode chip 2' together with part of the first and second leads 3', 2'.

Similarly to the first embodiment, the first lead 3' has two terminal legs 3a' transversely spaced from each other, whereas the second lead 4' has a single terminal leg 4a' extending into the spacing between the two terminal legs 3'. Thus, the diode 1' may be mounted in two different orientation with correct polarity.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

I claim:

1. A polar electronic component comprising:

a polar element having a first pole and a second pole opposite in polarity to the first pole;

a first lead electrically connected to the first pole of the polar element;

a second lead electrically connected to the second pole of the polar element; and an insulating package enclosing the polar element together with part of the first and second leads, the package having a mounting face;

wherein the first lead has two terminal legs which are bent toward the mounting face of the package and transversely spaced from each other by an interval; and wherein the second lead has a terminal leg which is bent toward the mounting face of the package and extends into the spacing between the two terminal legs of the first lead in longitudinally overlapping relation, the terminal leg of the second lead having a width smaller than the interval between the two terminal legs of the first lead.

2. The component according to claim 1, wherein the package has a first side face and a second side face opposite to the first side face, the two terminal legs of the first lead projecting out from the first side face of the package, the terminal leg of the second lead projecting out from the second side face of the package.

3. The component according to claim 1, wherein the component is a solid electrolytic capacitor.

4. The component according to claim 1, wherein the component is diode.

5. A structure for mounting a polar electronic component on a circuit carrier, the component comprising:

a polar element having a first pole and a second pole opposite in polarity to the first pole;

a first lead electrically connected to the first pole of the polar element;

a second lead electrically connected to the second pole of the polar element; and an insulating package enclosing the polar element together with part of the first and second leads, the package having a mounting face;

wherein the first lead has two terminal legs which are bent toward the mounting face of the package and transversely spaced from each other by an interval;

wherein the second lead has a terminal leg which is bent toward the mounting face of the package and extends into the spacing between the two terminal legs of the first lead in longitudinally overlapping relation, the terminal leg of the second lead having a width smaller than the interval between the two terminal legs of the first lead;

wherein the circuit carrier is formed with a pair of first electrode pads which are spaced from each other and attached in electric conduction with the two terminal legs of the first lead; and wherein the circuit carrier is also formed with a second electrode pad located between the pair of first electrode pads and attached in electric conduction with the terminal leg of the second lead.

6. The structure according to claim 5, wherein the first and second electrode pads are in the form of strips having respective end edges, the first electrode pads having their end edges being aligned with the end edge of the second electrode pad.

* * * * *